US010699883B2

(12) United States Patent
Teruuchi

(10) Patent No.: US 10,699,883 B2
(45) Date of Patent: Jun. 30, 2020

(54) PLASMA PROCESSING APPARATUS, METHOD OF OPERATING PLASMA PROCESSING APPARATUS, AND POWER SUPPLY DEVICE

(71) Applicant: TOKYO ELECTRON LIMITED, Tokyo (JP)

(72) Inventor: Satoru Teruuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 688 days.

(21) Appl. No.: 15/309,399

(22) PCT Filed: Jun. 1, 2015

(86) PCT No.: PCT/JP2015/065771
§ 371 (c)(1),
(2) Date: Nov. 7, 2016

(87) PCT Pub. No.: WO2015/190336
PCT Pub. Date: Dec. 17, 2015

(65) Prior Publication Data
US 2017/0110297 A1   Apr. 20, 2017

(30) Foreign Application Priority Data
Jun. 11, 2014   (JP) ................. 2014-120251

(51) Int. Cl.
*H01J 37/32*   (2006.01)
*H05H 1/46*   (2006.01)
(Continued)

(52) U.S. Cl.
CPC ........ *H01J 37/32724* (2013.01); *F27D 11/02* (2013.01); *H01J 37/32091* (2013.01);
(Continued)

(58) Field of Classification Search
CPC ...... H01J 37/32; H01J 37/32724; H01J 21/00; H01J 21/02; H01J 21/022; H01J 21/02263; H01J 21/02164
(Continued)

(56) References Cited

U.S. PATENT DOCUMENTS

| 6,847,014 B1* | 1/2005 | Benjamin ......... H01L 21/67248 |
| | | 219/444.1 |
| 2014/0087567 A1* | 3/2014 | Toyoda ................... C23C 16/44 |
| | | 438/782 |
| 2015/0087160 A1* | 3/2015 | Toyoda ................ C23C 16/345 |
| | | 438/778 |

FOREIGN PATENT DOCUMENTS

| CN | 1529994 A | 9/2004 |
| JP | S60-246416 A | 12/1985 |

(Continued)

OTHER PUBLICATIONS

International Search Report issued in PCT/JP2015/065771; dated Aug. 18, 2015.

*Primary Examiner* — Dana Ross
*Assistant Examiner* — Ayub A Maye
(74) *Attorney, Agent, or Firm* — Studebaker & Brackett PC

(57) ABSTRACT

A plasma processing apparatus according to an embodiment includes a processing container, a mounting table, a plurality of heaters, and a power supply device. The mounting table is provided in the processing container. The plurality of heaters are provided in the mounting table. The power supply device supplies electric power to the plurality of heaters. The power supply device includes a plurality of transformers and a plurality of zero-cross control type solid state relays (SSRs). The plurality of transformers are configured to step down a voltage from an alternating-current power source. Each of the plurality of transformers includes
(Continued)

a primary coil and a secondary coil. The primary coil is connected to the alternating-current power source. Each of the plurality of SSRs is provided between one corresponding heater among the plurality of heaters and the secondary coil of one corresponding transformer among the plurality of transformers.

12 Claims, 8 Drawing Sheets

(51) Int. Cl.
      *H01L 21/02*      (2006.01)
      *H01L 21/3065*    (2006.01)
      *H01L 21/67*      (2006.01)
      *H05B 3/28*       (2006.01)
      *F27D 11/02*      (2006.01)
      *H01L 21/683*     (2006.01)
      *H05B 3/62*       (2006.01)

(52) U.S. Cl.
      CPC ........ *H01J 37/32908* (2013.01); *H01L 21/02* (2013.01); *H01L 21/3065* (2013.01); *H01L 21/67069* (2013.01); *H01L 21/67103* (2013.01); *H01L 21/67248* (2013.01); *H01L 21/6831* (2013.01); *H05B 3/283* (2013.01); *H05B 3/62* (2013.01); *H05H 1/46* (2013.01); *H01J 37/32183* (2013.01); *H01J 37/32834* (2013.01); *H01J 2237/2001* (2013.01); *H01J 2237/334* (2013.01); *H05H 2001/4682* (2013.01)

(58) Field of Classification Search
      USPC .......................... 219/476, 477, 478, 479, 480
      See application file for complete search history.

(56) References Cited

FOREIGN PATENT DOCUMENTS

| | | |
|---|---|---|
| JP | H03-165483 A | 7/1991 |
| JP | H07-183281 A | 7/1995 |
| JP | 2004-241745 A | 8/2004 |
| JP | 2004-533718 A | 11/2004 |
| JP | 2011-187404 A | 9/2011 |
| JP | 2011-187637 A | 9/2011 |
| JP | 5222850 B2 | 6/2013 |
| WO | 02/089531 A1 | 11/2002 |
| WO | 2008/027305 A2 | 3/2008 |

\* cited by examiner

PLASMA PROCESSING APPARATUS, METHOD OF OPERATING PLASMA PROCESSING APPARATUS, AND POWER SUPPLY DEVICE

TECHNICAL FIELD

Embodiments of the present invention relate to a plasma processing apparatus, a method of operating a plasma processing apparatus, and a power supply device.

BACKGROUND ART

In fine processing for manufacturing a device such as a semiconductor device or a Flat Panel Display(FPD), plasma processing is performed on a workpiece such as a semiconductor substrate or a glass substrate. In the plasma processing, control with respect to a temperature or a temperature distribution of the workpiece in addition to control with respect to a plasma density distribution on the workpiece is important. If the temperature control with respect to the workpiece is not appropriately performed, uniformity of reaction in the surface of the workpiece cannot be secured, and manufacturing yield of the device deteriorates.

In general, in a plasma processing apparatus which is used in plasma processing, a mounting table on which a workpiece is placed is provided in a processing container. The mounting table has a high-frequency electrode function which applies high frequency wave to a plasma generation space, a holding function which holds a workpiece by electrostatic attraction or the like, and a temperature control function which controls the temperature of a workpiece by heat transfer.

In the plasma processing which uses such a plasma processing apparatus, a distribution in heat input characteristics with respect to the workpiece may be occur due to nonuniformity of plasma and radiant heat from a wall configuring the processing container, and/or a heat distribution in the mounting table. Accordingly, it is necessary to appropriately correct the heat distribution of the workpiece with the temperature control function of the mounting table.

Conventionally, a heater, which is a resistive heating element, is incorporated into the mounting table as the temperature control function in order to control the temperature of the mounting table and the temperature of the workpiece. The temperature of the workpiece is controlled by controlling a current supplied to the heater. As described above, the heat input characteristics with respect to the workpiece have a nonuniform distribution. Accordingly, in order to eliminate the nonuniform heat input characteristics, a mounting table has been developed which is configured by providing a plurality of heaters in a plurality of segments defined in the mounting table, respectively. Moreover, it is necessary to set regions of a workpiece which are temperature control objects into finely divided regions according to a process, and therefore, as described in Patent Literature 1, it is necessary to increase the number of the segments defined in the mounting table.

In order to individually control the temperatures of the plurality of regions of the workpiece by the plurality of heaters provided in the mounting table as described above, it is necessary to appropriately control electric power supplied to the heaters. To this end, in general, a thyristor which adjusts the electric power supplied to each heater is provided between each heater and a power source, as described in Patent Literature 2. FIGS. 8A and 8B are diagrams illustrating a principle of a thyristor. In general, the thyristor adopts a phase control method, and as shown in FIG. 8A, it is possible to control a period within which the heater and the power source are electrically connected to each other, that is, a conduction angle θ, by performing switching between ON/OFF. Accordingly, a current shown in FIG. 8B is supplied to the heater.

CITATION LIST

Patent Literature

[Patent Literature 1] Japanese Patent No. 5222850
[Patent Literature 2] Japanese Patent Application Laid-Open Publication No. 2011-187637

SUMMARY OF INVENTION

Technical Problem

If the number of the plurality of segments defined in the mounting table as described above increases, the areas of the segments become different from each other. Accordingly, if resistance values per unit area of the heaters provided in the plurality of segments are the same as each other, the plurality of heaters provided in the plurality of segments include heaters having resistance values different from each other. Accordingly, variations may occur in resolution of a temperature control of the plurality of heaters.

In order to make the resistance values of the plurality of heaters equal, it is necessary to reduce a thickness of the heater provided in a segment having a small area to increase the resistance value of the heater. An excessive current cannot be supplied to such a heater of which the resistance value is increased, due to limitation of a power source, and as a result, a dynamic range of the temperature control becomes small. Accordingly, variations in the resistance values of the plurality of heaters have to be accepted.

In addition, in general, each heater is electrically connected to a power source via two wires, and as described above, if the number of segments increases, the number of wires for supplying power to the plurality of heaters increases, and it may be difficult to arrange the wires in the mounting table. Accordingly, it is conceivable that some of the heaters share one wire of the two wires. In this configuration, the heaters sharing the wire are connected to a power source in parallel, and a combined resistance value of the heaters becomes a small resistance value. Accordingly, the power source supplies a large current. Even when such a large current is supplied, if the thyristor is connected to each of the plurality of heaters, it is possible to adjust the amount of the current supplied to each heater.

As described above, since the power source and the heater can be electrically connected to each other at an arbitrary timing by switching between ON/OFF of the thyristor, it is possible to realize high temperature control resolution. However, as shown in FIG. 8B, since a current waveform generated by the switching of the thyristor becomes a discontinuous current waveform, noise having high-harmonic components is generated. As a result, a failure (burning of a phase lead capacitor) may occur in another load which is connected to a primary side (power source supply side).

Accordingly, it is necessary to control power supply to the plurality of heaters to obtain high temperature control resolution and reduce harmonic noise.

Solution to Problem

In an aspect, there is provided a plasma processing apparatus for performing plasma processing on a workpiece.

The plasma processing apparatus according to the aspect includes a processing container, a mounting table, a plurality of heaters, and a power supply device. The mounting table is provided in the processing container. The plurality of heaters are provided in the mounting table. The power supply device supplies electric power to the plurality of heaters. The power supply device includes a plurality of transformers and a plurality of zero-cross control type solid state relays. The plurality of transformers are configured to step down a voltage from an alternating-current power source. Each of the plurality of transformers includes a primary coil and a secondary coil. The primary coil is connected to the alternating-current power source. The plurality of zero-cross control type solid state relays are solid state relays which control ON/OFF at a voltage of approximately zero voltage. Each of the plurality of zero-cross control type solid state relays is provided between one corresponding heater among the plurality of heaters and the secondary coil of one corresponding transformer among the plurality of transformers.

In the plasma processing apparatus, supply of currents to the heaters is controlled by the zero-cross control type solid state relays. Since the zero-cross control type solid state relays control ON/OFF when an output voltage is a voltage of approximately 0 V, it is possible to suppress occurrence of currents having high-harmonic components, that is, occurrence of harmonic noise. In addition, voltages which are lower than the voltage from the alternating-current power source are output to secondary sides due to the plurality of transformers. Accordingly, currents output from the secondary coils of the plurality of transformers decrease. Since supply or stoppage of supply of thus output currents to the heater is switched by the solid state relay, it is possible to enhance resolution with respect to heating values of the plurality of heaters. As a result, it is possible to enhance resolution with respect to the temperature control of each of the plurality of regions of the workpiece.

In an embodiment, the plasma processing apparatus may further include a plurality of first wires and a plurality of second wires. The plurality of first wires individually connect first terminals of the plurality of heaters and the plurality of zero-cross control type solid state relays. Each of the plurality of second wires commonly connects second terminals of two or more corresponding heaters among the plurality of heaters and the secondary coil of one corresponding transformer among the plurality of transformers. In this embodiment, heater groups including some heaters among the plurality of heaters are connected to the alternating-current power source in parallel. The combined resistance value of the heaters connected in parallel is smaller than the resistance value of each heater. However, since the voltages stepped down by the transformers are output to the secondary sides, it is possible to decrease the currents supplied to the heaters. Accordingly, it is possible to enhance resolution with respect to heating values of the plurality of heaters. As a result, it is possible to enhance resolution with respect to the temperature control of each of the plurality of regions of the workpiece.

In an embodiment, two or more heaters which are connected to a common second wire among the plurality of second wires may have the same resistance value as each other. According to this embodiment, it is possible to uniformize the resolution with respect to the heating values of two or more heaters connected to each other in parallel.

In an embodiment, the power supply device may further include a plurality of switchers which change transformation ratios of the plurality of transformers. According to this embodiment, it is possible to adjust the voltages output to the secondary sides. Accordingly, it is possible to adjust the magnitudes of the currents supplied to the heaters.

In an embodiment, the plasma processing apparatus may further include a controller which controls the plurality of switchers, and the controller may perform a first control which controls the plurality of switchers to set the transformation ratios of the plurality of transformers, and a second control which controls the plurality of switchers to set the transformation ratios of the plurality of transformers to transformation ratios which are higher than the transformation ratios of the plurality of transformers set in the first control. According to this embodiment, in the first control, high voltages are output to the secondary sides to supply large currents to the heaters, and it is possible to rapidly heat the heaters. In addition, after the heaters are rapidly heated and the temperatures of the heaters approach a target temperature, low voltages are output to the secondary sides in the second control to supply small currents to the heaters, and it is possible to increase controllability of the heating values of the heaters.

In another aspect, there is provided a method for operating the plasma processing apparatus according to the embodiment. This operation method includes a first step of controlling the plurality of switchers to set the transformation ratios of the plurality of transformers, and a second step of controlling the plurality of switchers to set the transformation ratios of the plurality of transformers to transformation ratios which are higher than the transformation ratios of the plurality of transformers set in the first process. According to this operation method, in the first process, high voltages are output to the secondary sides to supply large currents to the heaters, and it is possible to rapidly heat the heaters. In addition, after the heaters are rapidly heated and the temperatures of the heaters approach a target temperature, low voltages are output in the second step to the secondary sides to supply small currents to the heaters, and it is possible to enhance controllability of the heating values of the heaters.

In still another aspect, there is provided a power supply device for supplying electric power to a plurality of heaters which are provided in a mounting table of a plasma processing apparatus. The power supply device includes a plurality of transformers and a plurality of zero-cross control type solid state relays. The plurality of transformers are configured to step down a voltage from an alternating-current power source. Each of the plurality of transformers includes a primary coil and a secondary coil. The primary coil is connected to the alternating-current power source. Each of the plurality of zero-cross control type solid state relays is provided between one corresponding heater among the plurality of heaters and the secondary coil of one corresponding transformer among the plurality of transformers.

In an embodiment, the power supply device may further include a plurality of switchers which change transformation ratios of the plurality of transformers.

Advantageous Effects of Invention

As described above, it is possible to control power supply to the plurality of heaters to obtain high temperature control resolution and reduce harmonic noise.

DESCRIPTION OF EMBODIMENTS

Figure 1:
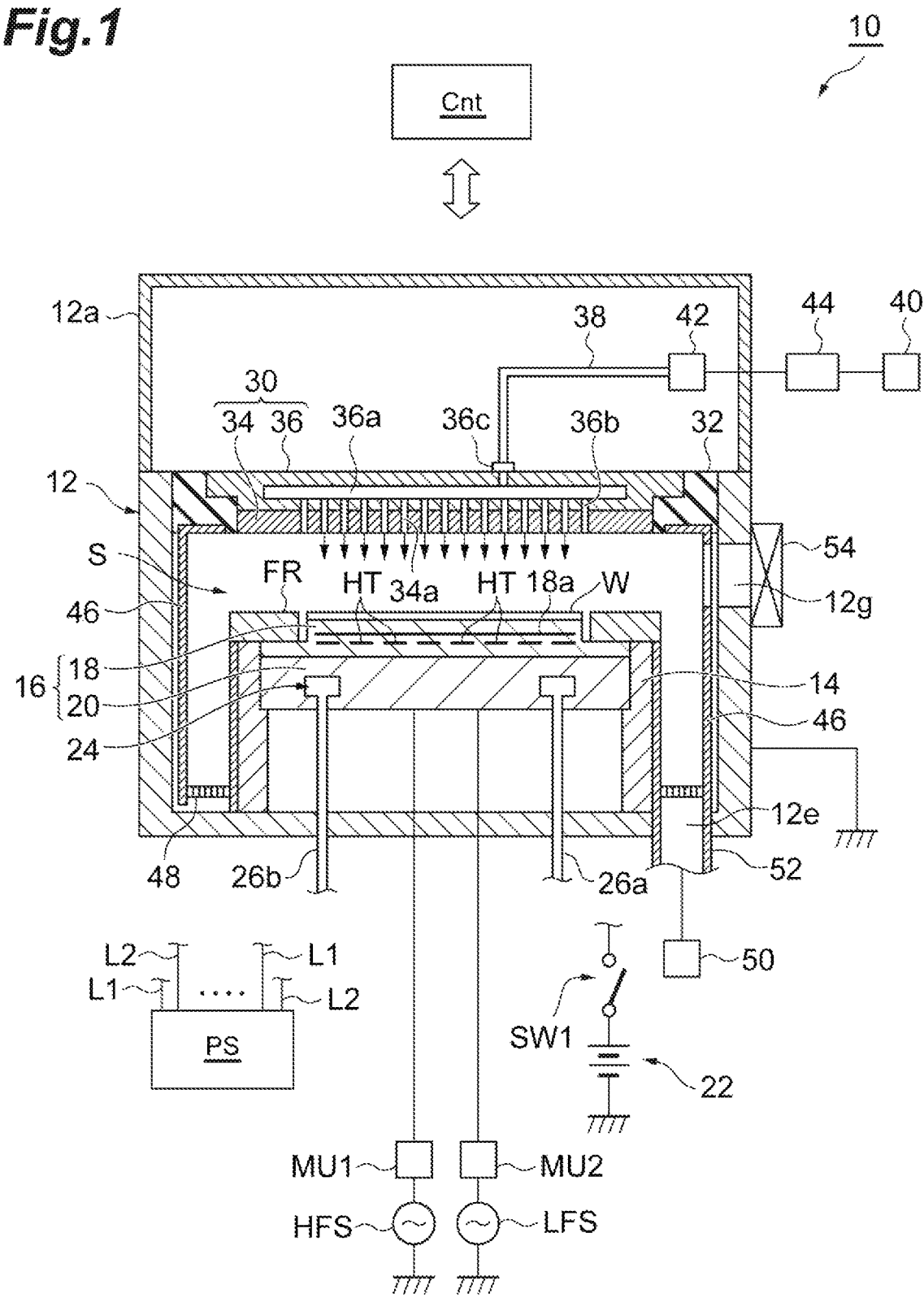
FIG. 1 is a diagram schematically illustrating a plasma processing apparatus according to an embodiment.

Hereinafter, various embodiments will be described in detail with reference to the drawings. In the drawings, the same or equivalent portions will be denoted with the same reference signs.

FIG. 1 is a diagram schematically illustrating a plasma processing apparatus according to an embodiment. FIG. 1 schematically shows a structure in a vertical section of the plasma processing apparatus according to the embodiment. A plasma processing apparatus 10 shown in FIG. 1 is a capacity coupled parallel flat plate plasma etching device. The plasma processing apparatus 10 includes a substantially cylindrical processing container 12. For example, the processing container 12 is formed of aluminum, and anodizing is performed on the surface of the processing container 12.

A mounting table 16 is provided in the processing container 12. The mounting table 16 includes an electrostatic chuck 18 and a base 20. The base 20 has a substantially discoid shape, and is formed of conductive metal such as, for example, aluminum. The base 20 configures a lower electrode. The base 20 is supported by a support portion 14. The support portion 14 is a cylindrical member which extends from the bottom portion of the processing container 12.

A first high-frequency power source HFS is electrically connected to the base 20 via a matching device MU1. The first high-frequency power source HFS is a power source which mainly generates high-frequency electric power for generating plasma, and generates frequency of 27 to 100 MHz, for example, high-frequency electric power of 40 MHz. The matching device MU1 includes a circuit for matching output impedance of the first high-frequency power source HFS and input impedance of a load side (base 20 side).

In addition, a second high-frequency power source LFS is electrically connected to the base 20 via a matching device MU2. The second high-frequency power source LFS mainly generates high-frequency electric power (high-frequency bias electric power) for attracting ions to a workpiece (hereinafter, referred to as a "wafer W"), and supplies the high-frequency bias electric power to the base 20. The frequency of the high-frequency bias electric power is frequency within a range from 400 kHz to 13.56 MHz, and for example, is 3 MHz. The matching device MU2 includes a circuit for matching output impedance of the second high-frequency power source LFS and input impedance of the load side (base 20 side).

An electrostatic chuck 18 is provided on the base 20. The electrostatic chuck 18 attracts the wafer W by an electrostatic force such as a Coulomb force to hold the wafer W. The electrostatic chuck 18 includes an electrode 18a for electrostatic attraction in a ceramic main body. A direct-current power source 22 is electrically connected to the electrode 18a via a switch SW1.

A plurality of heaters HT are built in the electrostatic chuck 18. Each of the plurality of heaters HT is a heating resistor, and a current is supplied to each heater to generate heat. Although the heater HT is not limited, for example, the heater HT may be a patterned thin-film heater. The heater HT may be a foil resistance element, and the foil resistance element may be metal.

Figure 2:
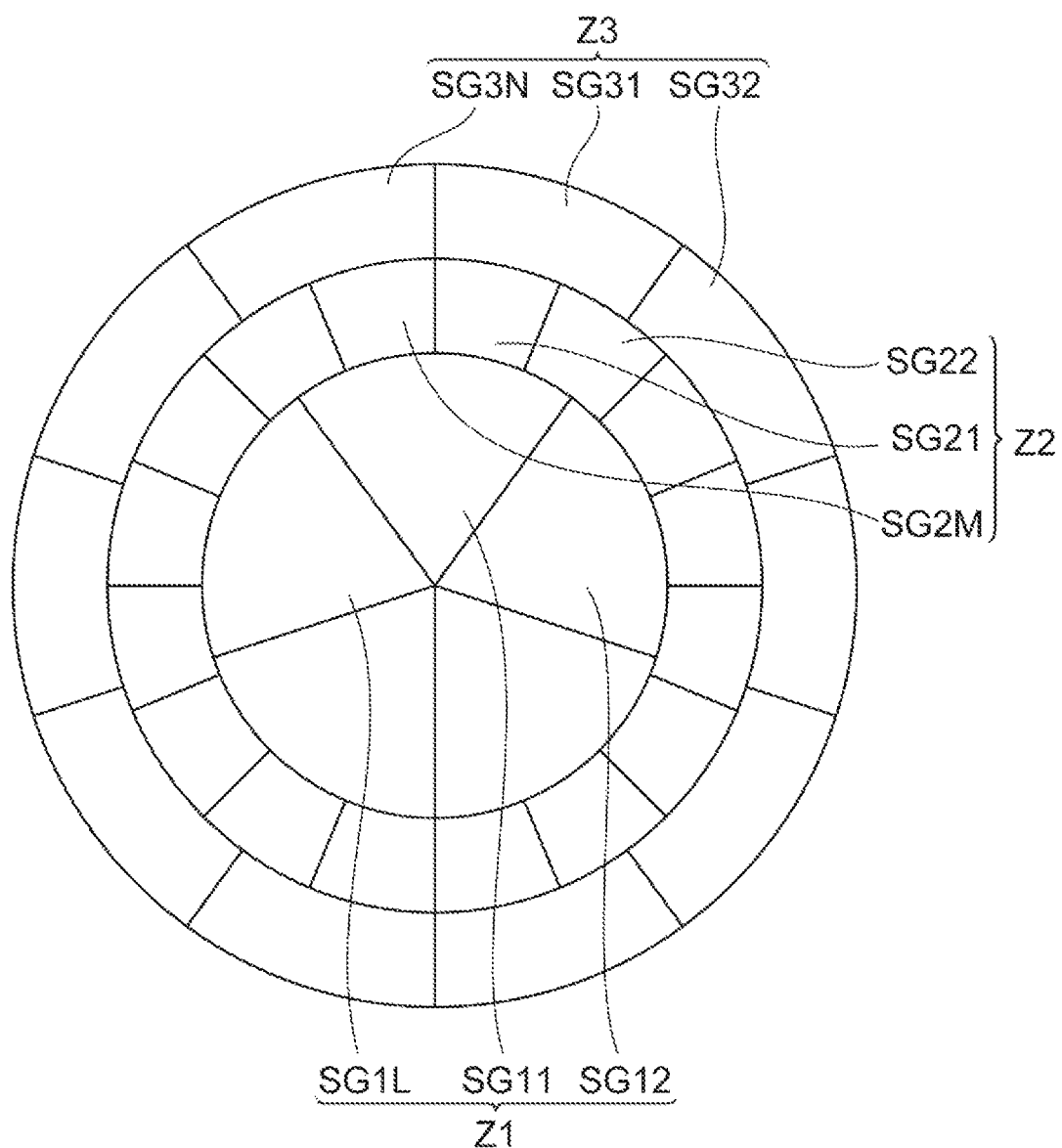
FIG. 2 is a plan diagram illustrating an example of a layout of a plurality of heaters in an electrostatic chuck.

FIG. 2 is a plan diagram illustrating an example of a layout of the plurality of heaters in the electrostatic chuck. As shown in FIG. 2, a plurality of zones Z1, Z2, and Z3 are defined in the electrostatic chuck 18 when the electrostatic chuck 18 is viewed in a vertical direction. The zones Z1 to Z3 are concentric zones. That is, the zone Z1 is a circular zone including the center of the electrostatic chuck 18, the zone Z2 is an approximately annular zone surrounding the zone Z1, and the Z3 is an approximately annular zone surrounding the zone Z2.

A plurality of segments are defined in the zones Z1 to Z3. That is, the plurality of segments are defined in the electrostatic chuck 18. As shown in FIG. 2, in an example, segments are defined in the zone Z1 to divide the zone Z1 into L segments, and the segments are referred to as SG11 to SG1L. Segments are defined in the zone Z2 to divide the zone Z2 into M segments, and the segments are referred to as SG21 to SG2M. Segments are defined in the zone Z3 to divide the zone Z3 into N segments, and the segments are referred to as SG31 to SG3N. The plurality of heaters HT are disposed in the plurality of segments, respectively. In an embodiment, the plurality of heaters HT are heating resistors which have the same resistance value per unit length as each other. In addition, as shown in FIG. 2, the plurality of segments includes segments which have areas different from each other. Accordingly, the plurality of heaters HT include heaters having resistance values different from each other. Electric power is supplied to the plurality of heaters HT by a power supply device PS shown in FIG. 1.

It should be noted that the zones and segments defined in the electrostatic chuck 18 are not limited to the embodiment shown in FIG. 2. For example, a plurality of segments which are partitioned by lattice-shaped boundaries may be defined in the electrostatic chuck 18, or a plurality of segments which concentrically divides the region in the electrostatic chuck 18 may be defined. In addition, zones having the number which is greater than the number of the zones shown in FIG. 2 may be defined, and the number of the segments in each zone may be greater or smaller than the number of the segments shown in FIG. 2.

As shown in FIG. 1, a focus ring FR is provided on the surface of the base 20 and around the electrostatic chuck 18. The focus ring FR is provided so as to improve uniformity of plasma processing. The focus ring FR is formed of a material which is appropriately selected according to the plasma processing to be performed, and for example, may be formed of silicon or quartz.

A coolant channel 24 is formed in the base 20. Coolant is supplied from a chiller unit provided outside the processing container 12 to the coolant channel 24 via a pipe 26a. The coolant supplied to the coolant channel 24 is returned to the chiller unit via a pipe 26b.

An upper electrode 30 is provided in the processing container 12. The upper electrode 30 is disposed to face the base 20 above the mounting table 16, and the base 20 and the upper electrode 30 are provided to be substantially parallel to each other.

The upper electrode 30 is supported at the upper portion of the processing container 12 via an insulating shield member 32. The upper electrode 30 may include an electrode plate 34 and an electrode support 36. The electrode plate 34 faces a processing space S, and provides a plurality of gas discharge holes 34a. The electrode plate 34 may be formed of a low-resistance conductor or semiconductor having small Joule heat.

The electrode support 36 detachably supports the electrode plate 34, and may be formed of a conductive material such as, for example, aluminum. The electrode support 36 may have a water cooling structure. A gas diffusion chamber 36a is provided in the electrode support 36. A plurality of gas communication holes 36b which communicate with the gas discharge holes 34a extend downward from the gas diffusion chamber 36a. A gas introduction port 36c through which a processing gas is introduced into the gas diffusion chamber 36a is formed in the electrode support 36, and a gas supply pipe 38 is connected to the gas introduction port 36c.

A gas source group 40 is connected to the gas supply pipe 38 via a valve group 42 and a flow controller group 44. The valve group 42 includes a plurality of ON-OFF valves, and the flow controller group 44 includes a plurality of flow controllers such as a mass flow controller. In addition, the gas source group 40 includes gas sources for various kinds of gases required for the plasma processing. Each of the plurality of gas sources of the gas source group 40 is connected to the gas supply pipe 38 via the corresponding ON-OFF valve and the corresponding mass flow controller.

In the plasma processing apparatus 10, one or more gases are supplied to the gas supply pipe 38 from one or more gas sources selected from the plurality of gas sources of the gas source group 40. The gas supplied from the gas supply pipe 38 reaches the gas diffusion chamber 36a, and is output to the processing space S via the gas communication holes 36b and the gas discharge holes 34a.

In addition, as shown in FIG. 1, the plasma processing apparatus 10 may further include a ground conductor 12a. The ground conductor 12a is a substantially cylindrical ground conductor, and is provided to extend from the side wall of the processing container 12 to the portion above the height position of the upper electrode 30.

Moreover, in the plasma processing apparatus 10, a deposit shield 46 is detachably provided along the inner wall of the processing container 12. In addition, the deposit shield 46 is also provided on the outer periphery of the support portion 14. The deposit shield 46 prevents etching by-products (deposits) from being attached to the processing container 12, and may be formed by coating an aluminum material with ceramics such as $Y_2O_3$.

An exhaust plate 48 is provided between the support portion 14 and the inner wall of the processing container 12 on the bottom portion side of the processing container 12. For example, the exhaust plate 48 may be formed by coating an aluminum material with ceramics such as $Y_2O_3$. An exhaust port 12e is provided in the processing container 12 below the exhaust plate 48. An exhaust device 50 is connected to the exhaust port 12e via the exhaust pipe 52. The exhaust device 50 includes a vacuum pump such as a turbo-molecular pump, and can reduce the pressure inside the processing container 12 to a desired vacuum degree. In addition, a transfer-in/out port 12g for the wafer W is provided in the side wall of the processing container 12, and the transfer-in/out port 12g can be opened and closed by a gate valve 54.

In addition, the plasma processing apparatus 10 may further include a controller Cnt. The controller Cnt is a computer which includes a processor, a storage unit, an input unit, a display unit, or the like, and controls each portion of the plasma processing apparatus 10. In the controller Cnt, an operator can perform input operations or the like of commands for managing the plasma processing apparatus 10 using the input unit, and can visualize and display an operation situation of the plasma processing apparatus 10 using the display unit. In addition, a control program for controlling various processing executed by the plasma processing apparatus 10 using the processor, or a program for executing processing on each constituent parts of the plasma processing apparatus 10 according to processing conditions, that is, a process recipe are stored in the storage unit of the controller Cnt.

Figure 3:
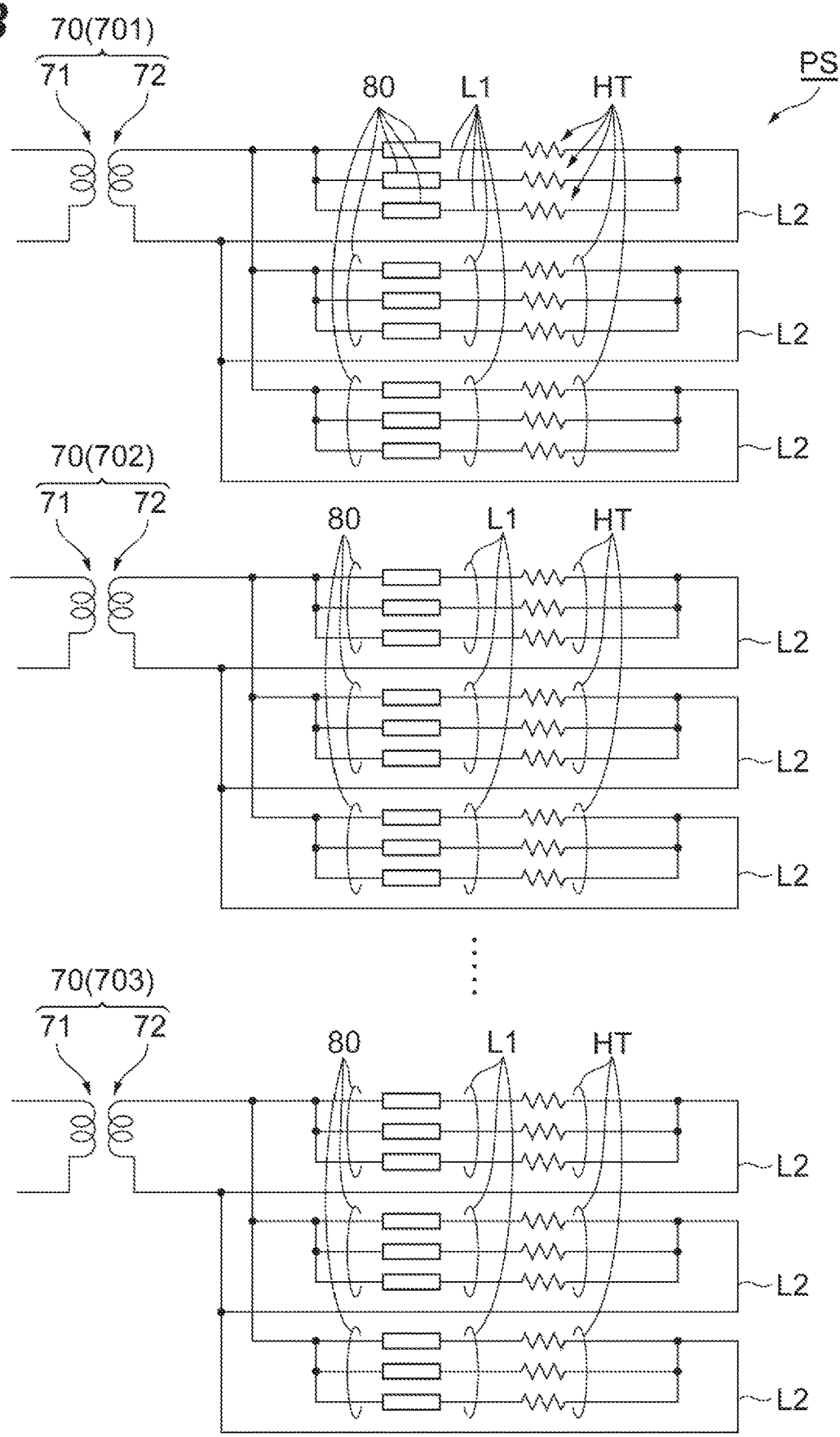
FIG. 3 is a diagram illustrating a power supply device according to an embodiment.
Figure 4:
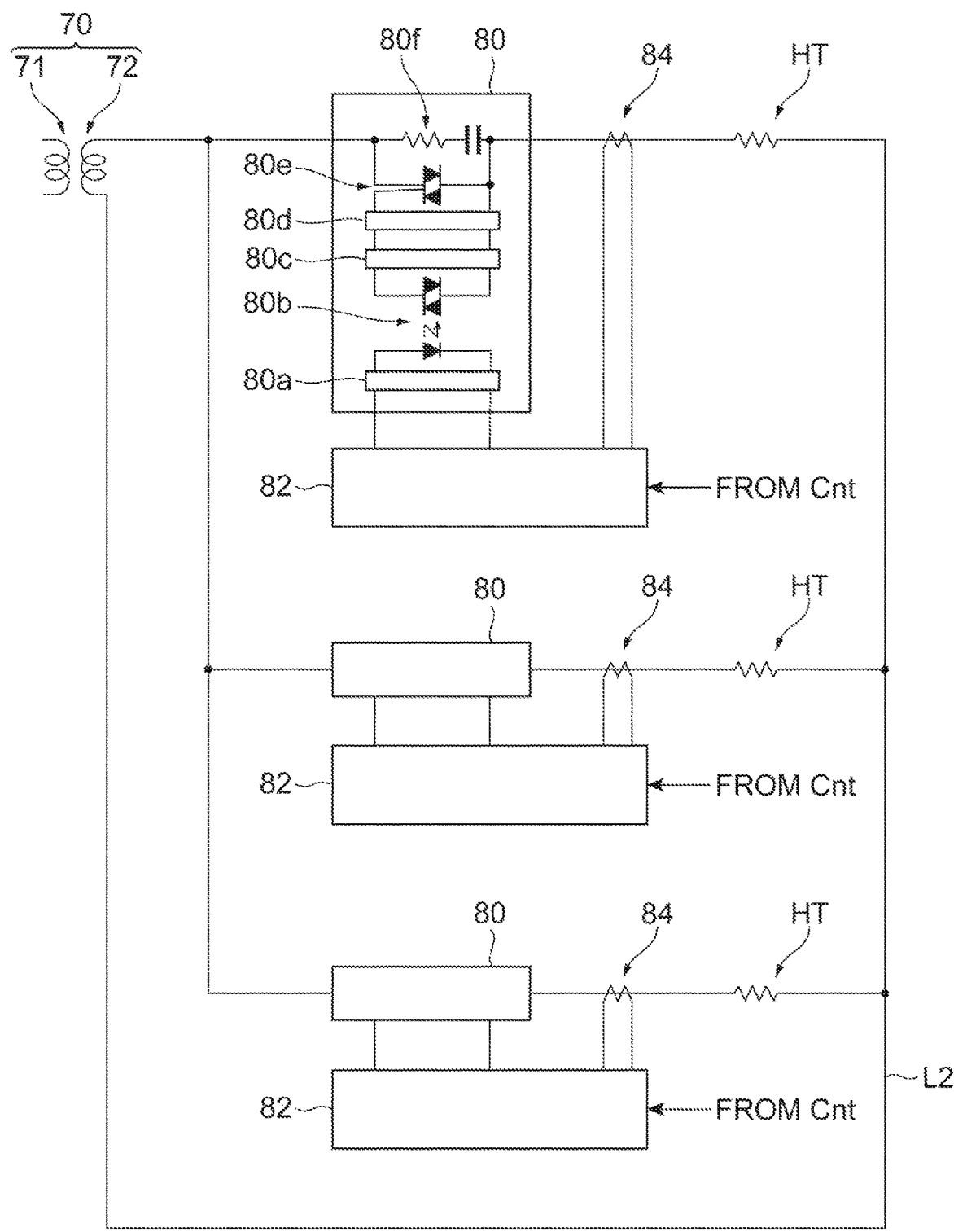
FIG. 4 is a diagram illustrating a portion of the power supply device according to the embodiment and a configuration of a solid state relay.

FIG. 3 is a diagram illustrating the power supply device according to an embodiment. In addition, FIG. 4 is a diagram illustrating a portion of the power supply device according to the embodiment and a configuration of a SSR 80. The power supply device PS includes a plurality of transformers 70 and a plurality of zero-cross control type solid state relays 80 (hereinafter, referred to as "SSRs 80"). Each of the plurality of transformers 70 includes a primary coil 71 and a secondary coil 72. The primary coil 71 is electrically connected to an alternating-current power source, for example, to a three-phase alternating-current power source.

Each of the SSRs 80 is provided between one corresponding heater HT among the plurality of heaters HT and a secondary coil 72 of one corresponding transformer among the plurality of transformers 70. A first terminal of each of the plurality of heaters HT is connected to one corresponding SSR 80 via a first wire L1. The SSR 80 is connected to the secondary coil 72 of the corresponding transformer 70. In the embodiment shown in FIG. 3, nine SSRs 80 are connected to the secondary coil 72 of one transformer 70. It should be noted that the heater HT which is connected to one transformer 70 via the SSR 80 may be arbitrarily set.

As shown in FIG. 4, the SSR 80 includes an input circuit 80a, a photo-coupler 80b, a zero-cross circuit 80c, a trigger circuit 80d, a triac 80e, and a snubber circuit 80f. A temperature control unit 82 is connected to the input circuit 80a. The temperature control unit 82 inputs control signals for adjusting a period in which the heater HT and the transformer 70 are electrically connected to each other, to the input circuit 80a. The temperature control unit 82 receives a signal sent from the controller Cnt so as to heat the heater HT by the heating value according to the recipe, and generates a control signal for adjusting the period in which the heater HT and the transformer 70 are electrically connected to each other according to the received signal. In addition, the temperature control unit 82 receives a current value measured by a current monitor 84, and generates the control signal corresponding to the current value.

The input circuit 80a outputs an input signal transmitted to a light-emitting element of the photo-coupler 80b in response to the control signal from the temperature control unit 82. If the input signal is turned on, the SSR 80 is turned on at approximately zero voltage and electrically connects the heater HT and the transformer 70 to each other. On the other hand, if the input signal is turned off, the SSR 80 is turned off at approximately zero voltage, and a current is not substantially supplied to the heater HT.

Figure 5:
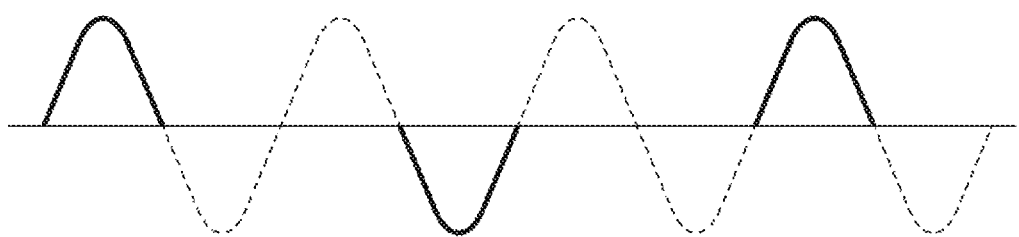
FIG. 5 is a diagram illustrating an example of a waveform of a current generated by a zero-cross control type solid state relay.

FIG. 5 shows an example of waveforms of a current generated by the ON/OFF control of the SSR. In FIG. 5, a current having a waveform shown by a solid line indicates a current supplied to the heater HT, and a waveform shown by a dotted line indicates that a current is not supplied to the heater HT in the period in which the SSR 80 is turned off According to the SSR 80, the electric connection state between the heater HT and the transformer 70 is switched at approximately zero voltage. Accordingly, as shown in FIG. 5, high-frequency components in the waveforms of the generated currents are decreased. Therefore, it is possible to decrease occurrence of high-frequency noises according to the SSR 80. In addition, the SSR 80 enables high-speed and high-frequency ON/OFF switching, and since the SSR 80 is a non-contact relay, there are advantages that contact failures do not occur and that operation sound does not occur. Moreover, there is an advantage that the SSR 80 is cheaper than a thyristor.

As shown in FIG. 3, the plurality of heaters HT are arranged in parallel in every groups each of which includes two or more heaters HT. Specifically, the second terminals of two or more heaters HT configuring one group are electrically connected to one common wire, that is, the second wire L2. In addition, as shown in FIG. 3, one or more second wires L2 are connected to the secondary coil 72 of one transformer 70. In other words, each of the plurality of second wires L2 is commonly connected to the second terminals of two or more corresponding heaters among the plurality of heaters HT and the secondary coil 72 of the corresponding transformer among the plurality of transformers 70. In the embodiment shown in FIG. 3, the number of heaters HT which are commonly connected to one second wire L2 is three. However, the number of heaters HT which are commonly connected to one second wire L2 may be arbitrarily set. Moreover, in the embodiment shown in FIG. 3, three second wires L2 are connected to the secondary coil 72 of one transformer 70. However, the number of the second wires L2 connected to the secondary coil 72 of the one transformer 70 may be arbitrarily set.

Each of the plurality of transformers 70 outputs a voltage stepped down from a primary side voltage, to the secondary coil 72. Here, a first example of the power supply device PS will be discussed. In the first example, as shown in FIG. 3, let us suppose that nine heaters HT are connected to each of the plurality of transformers 70, that is, a transformer 701, a transformer 702, and a transformer 703, in parallel. Moreover, let us suppose that the resistance values of nine heaters HT connected to one transformer are 45.5Ω, 40.4Ω, 22.5Ω, 45.5Ω, 40.4Ω, 22.5Ω, 45.5Ω, 40.4Ω, and 22.5Ω, respectively. Moreover, let us suppose that a voltage from a R phase-S phase of the three-phase alternating-current power source are applied to the transformer 701, a voltage from a S phase-T phase of the three-phase alternating-current power source are applied to the transformer 702, and a voltage from a R phase-T phase of the three-phase alternating-current power source are applied to the transformer 703.

In the first example, the combined resistance value of the nine heaters HT connected to each transformer is 3.7Ω. In a case where a combined resistance of 3.7Ω is connected to each phase of the alternating-current power source of 200V, a phase current per one phase becomes 200 V/3.7Ω×√3=93.6 A. Accordingly, if the transformer is not present, it is necessary to supply electric power of 93.6 A×200 V, and a breaker for protection is required. On the other hand, if the voltage is stepped down to 100 V by the transformer 70 (701, 702, or 703), the maximum current becomes 46.8 A. If the voltage is stepped down to 50V by the transformer 70 (701, 702, or 703), the maximum current becomes 23.4 A. Accordingly, it is possible to decrease the maximum current amount by utilizing the transformer 70.

As described above, when the voltage is stepped down by the transformer 70, it is possible to decrease the current amount, and it is possible to decrease the heating value of each heater HT with respect to the control output of the temperature control unit 82. Accordingly, it is possible to improve resolution of the control of the temperature control unit 82, that is, control resolution of the heating value of each heater HT with respect to the output resolution of the temperature control unit 82. Therefore, even when the heaters HT having resistance values different from each other are connected to each transformer 70 in parallel as in the first example, it is possible to improve the resolution of the temperature control performed by each heater HT. In addition, since the power supply device PS is configured by the transformers 70 and the SSRs 80, a cheap and small power supply device PS is provided. Further, in the configuration which includes the plurality of heaters HT which are respectively provided in the plurality of segments, it is possible to decrease current consumption.

Hereinafter, a second example of the power supply device PS will be discussed. In the second example, let us suppose that nine heaters HT connected to one transformer in parallel have approximately the same resistance value as each other. Specifically, let us suppose that the resistance value of each of the nine heaters HT connected to the transformer 701 is 45.5Ω. In addition, let us supposed that the resistance value of each of the nine heaters HT connected to the transformer 702 is 40.4Ω. Moreover, let us suppose that the resistance value of each of the nine heaters HT connected to the transformer 703 is 25.5Ω. In addition, let us suppose that the area of the segment in which each heater HT connected to the transformer 701 is provided is 2800 mm², the area of the segment in which each heater HT connected to the transformer 702 is provided is 2300 mm², and the area of the segment in which each heater HT connected to the transformer 703 is provided is 1200 mm². Moreover, let us suppose that a voltage from a R phase-S phase of the three-phase alternating-current power source are applied to the transformer 701, a voltage from a S phase-T phase of the three-phase alternating-current power source are applied to the transformer 702, and a voltage from a R phase-T phase of the three-phase alternating-current power source are applied to the transformer 703. In addition, let us suppose that the transformer 701 steps down the voltage to 100 V, the transformer 702 steps down the voltage to 75V, and the transformer 703 steps down the voltage to 50V.

In the second example, the combined resistance value of the nine heaters HT connected to the transformer 701 is 5.1Ω, the combined resistance value of the nine heaters HT connected to the transformer 702 is 4.5Ω, and the combined resistance value of the nine heaters HT connected to the transformer 703 is 2.5Ω. Accordingly, the current consumed by the R phase-S phase becomes 19.6 A, and the heating value at the R phase-S phase becomes 1960.8 W. In addition, the current consumed by the S phase-T phase becomes 19.8 A, and the heating value at the S phase-T phase becomes 1253.1 W. Moreover, the current consumed by the R phase-T phase becomes 20.0 A, and the heating value at the R phase-T phase becomes 1000 W. Accordingly, the heating value per unit area of the segment in which each heater HT connected to the transformer 701 is provided, that is, a heat generation density becomes 0.08 W/mm². Moreover, the heat generation density of the segment in which each heater HT connected to the transformer 702 is provided becomes 0.06 W/mm². The heat generation density of the segment in which each heater HT connected to the transformer 703 is provided becomes 0.09 W/mm². In the case where the heaters HT connected to one transformer in parallel have approximately the same resistance value as each other as described above, when the voltage is stepped down by the transformers 70, it is possible to decrease a difference between the respective heat generation densities in the plurality of segments. In addition, similarly to the first example, since the current amounts can be decreased by stepping down the voltage using the transformers 70, it is possible to improve the resolution of the temperature control performed by each heater HT.

Hereinafter, the resolution of the temperature control will be discussed, taking the heaters HT connected to the transformer 701 of the second example as an example. As described above, the resistance value of each of the nine heaters HT connected to the transformer 701 is 45.5Ω, and the area of the segment in which each heater HT is provided is 2800 mm². In addition, output resolution of the temperature control unit 82 is approximately 0.1%. The output resolution of the temperature control unit 82 means that the electric power supplied to the heater HT can be controlled by 0.1%. In this example, when the voltage is stepped down to 100 V by the transformer 701, the heating value of each heater HT becomes 219.8 W. Accordingly, the resolution with respect to the heating value becomes 0.1%× 219.8=0.2198 W. The heating value required to increase the temperature of each segment by 1° C. is calculated by area of the segment×heat flux of the segment. The heat flux is calculated from the combined heat resistance of the used material. Here, let us suppose that the heat flux is 0.67×10⁻³ [W/mm²]. Accordingly, the heating value required to increase the temperature of each segment by 1° C. becomes 2800 mm²×0.67×10⁻³ [W/mm²]=1.876 W. In a case where the output resolution of the temperature control unit 82 from the heating value is 0.1%, a temperature rise amount of 0.2198 W/1.876 W=0.117° C. is obtained. That is, the resolution of the temperature control of 0.117° C. is obtained. For example, since the resolution of the temperature control generally required is less than 1° C., according to this discussion, it is confirmed that high resolution of the temperature control is realized by the power supply device PS. In addition, by increasing the output resolution of the temperature control unit 82, for example, by setting the output resolution to 0.05%, higher resolution of the temperature control is obtained.

Figure 6:
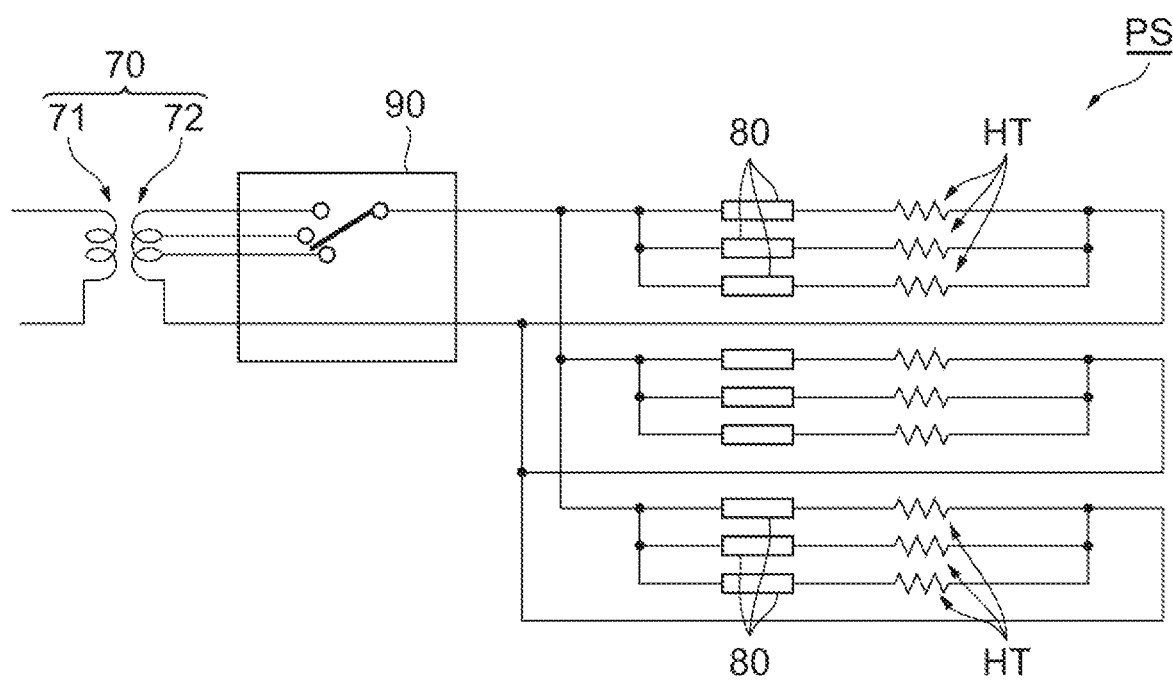
FIG. 6 is a diagram illustrating a portion of a power supply device according to another embodiment.

Hereinafter, another embodiment will be described. FIG. 6 is a diagram illustrating a portion of a power supply device according to another embodiment. As shown in FIG. 6, the power supply device PS includes a switcher 90 between each transformer 70 and the SSRs 80. That is, in the power supply device PS of another embodiment, the plurality of switchers 90 are connected to the plurality of transformers, respectively. The switchers 90 change transformation ratios of the respective transformers 70, and adjust the secondary side output voltages of the respective transformers 70. In one example, each of the switchers 90 may be configured of a relay circuit which selects any of a plurality of taps of the transformer 70 and is connected to the selected tap. In this example, each of the switchers 90 can switch the selected tap by the control of the above-described controller Cnt.

Figure 7:
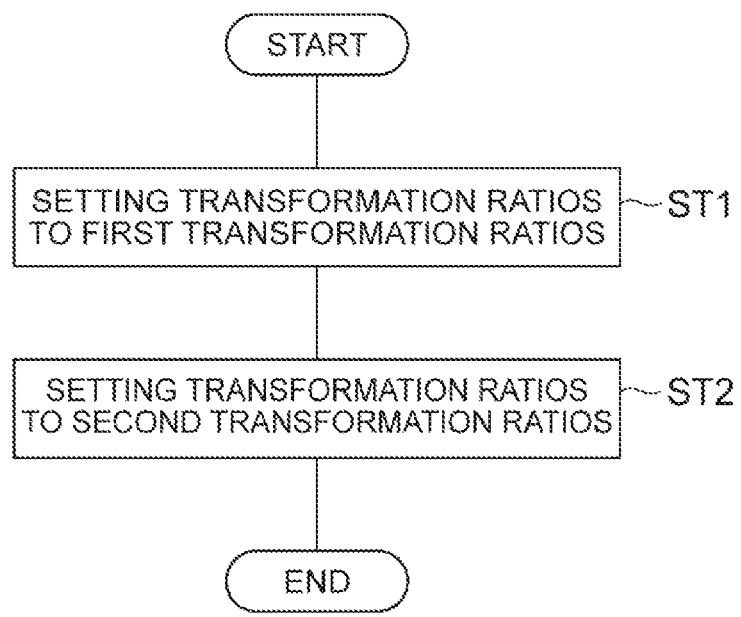
FIG. 7 is a flow chart illustrating an embodiment of a method for operating a plasma processing apparatus including the power supply device shown in FIG. 6.
Figure 8A:
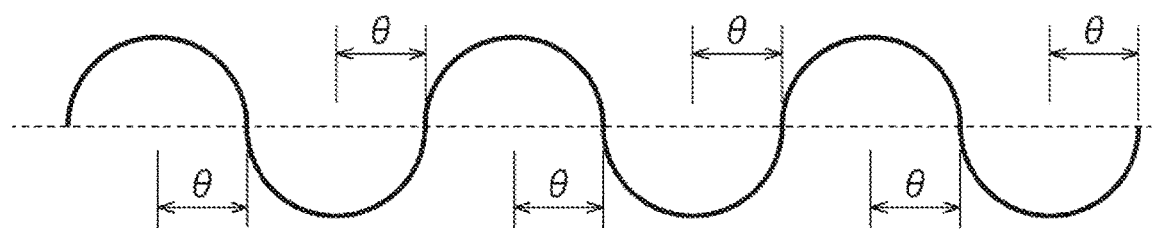
FIGS. 8A and 8B are diagrams illustrating a principle of a thyristor.
Figure 8B:
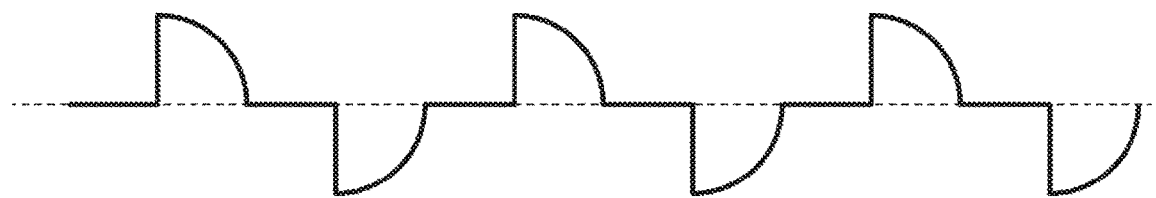

FIG. 7 is a flow chart illustrating an embodiment of a method for operating the plasma processing apparatus 10 including the power supply device shown in FIG. 6. The operation method shown in FIG. 7 includes a first step ST1 and a second step ST2. In the first step ST1, the plurality of switchers 90 which are respectively connected to the plurality of transformers 70 are controlled, and the transformation ratios of the transformers 70 are set. The controls of the plurality of switchers 90 in the first step ST1 may be performed according to the first control by the controller Cnt.

In the subsequent second step ST2, the plurality of switchers 90 are controlled, and the transformation ratios of the transformers 70 are set to transformation ratios which are higher than the transformation ratios of the plurality of transformers 70 set in the first step ST1. The controls of the plurality of switchers 90 in the second step ST2 may be performed according to the second control by the controller Cnt. According to the second step ST2, voltages which are lower than the secondary side voltages of the first step ST1 are output to the secondary sides of the transformers 70. Accordingly, the amounts of the currents supplied to the respective heaters HT connected to the transformers 70 are decreased. As a result, it is possible to increase the resolution of the temperature control in the second step ST2. Meanwhile, since large currents can be supplied to the heaters HT in the first step ST1, rapid heating can be performed.

For example, the operation method shown in FIG. 7 may be used when the temperature of the wafer W in the second step is required to be rapidly increased to be higher than the temperature of the wafer W in the first step in a case where the first step is performed and the second process is subsequently performed, using the plasma processing apparatus 10. In this example, the secondary side output voltages of the transformers 70 are increased to increase the amount of the current supplied to the heaters HT by switching connection destination to the tap by which a low transfoiniation ratio is obtained, and thereby the temperatures of the mounting table 16 and the wafer W can be rapidly increased by the heater HT. After the temperatures of the mounting table 16 and the wafer W are rapidly increased in this way, the secondary side output voltages of the transformers 70 are decreased to decrease the amount of the currents supplied to the heaters HT by switching connection destination to the tap by which a high transformation ratio is obtained, and thereby the temperatures of the mounting table 16 and the wafer W can be controlled with high accuracy by the heater HT.

Hereinbefore, various embodiments have been described. However, various modifications may be made without being limited to the above-described embodiments. For example, the plasma processing apparatus of each of the above-described embodiments is a capacity coupled plasma processing apparatus. However, the plasma processing apparatus may be an arbitrary type plasma processing apparatus. For example, the plasma processing apparatus may be a inductively coupled plasma processing apparatus, or may be a plasma processing apparatus which utilize surface waves such as microwaves as a plasma source.

REFERENCE SIGNS LIST

10: plasma processing apparatus, 12: processing container, 16: mounting table, 18: electrostatic chuck, 20: base, HT: heater, PS: power supply device, 70: transformer, 71: primary coil, 72: secondary coil, 80: solid state relay, 82: temperature control unit, 90: switcher, Cnt: controller

The invention claimed is:

1. A plasma processing apparatus for performing plasma processing on a workpiece, comprising:
a processing container;
a mounting table provided in the processing container;

a plurality of heaters which are provided in the mounting table; and a power supply device which supplies electric power to the plurality of heaters, wherein the power supply device includes:

a plurality of transformers configured to step down a voltage from an alternating-current power source, each of the plurality of transformers including a primary coil connected to the alternating-current power source and a secondary coil; and a plurality of zero-cross control type solid state relays each of which is provided between one corresponding heater among the plurality of heaters and the secondary coil of one corresponding transformer among the plurality of transformers to control heat on the workpiece.

2. The plasma processing apparatus according to claim 1, further comprising:

a plurality of first wires which individually connect first terminals of the plurality of heaters and the plurality of zero-cross control type solid state relays; and a plurality of second wires each of which commonly connects second terminals of two or more corresponding heaters among the plurality of heaters and the secondary coil of one corresponding transformer among the plurality of transformers.

3. The plasma processing apparatus according to claim 1, wherein the power supply device further includes a plurality of switchers which change transformation ratios of the plurality of transformers.

4. The plasma processing apparatus according to claim 2, wherein two or more heaters connected to a common second wire among the plurality of second wires have a same resistance value as each other.

5. The plasma processing apparatus according to claim 2, wherein two or more heaters connected to a common second wire among the plurality of second wires have respective resistances different from each other.

6. The plasma processing apparatus according to claim 3, further comprising:

a controller which controls the plurality of switchers, wherein the controller performs a first control which controls the plurality of switchers to set the transformation ratios of the plurality of transformers, and a second control which controls the plurality of switchers to set the transformation ratios of the plurality of transformers to transformation ratios which are higher than the transformation ratios of the plurality of transformers set in the first control.

7. The plasma processing apparatus according to claim 3, wherein each of the plurality of switchers comprises a relay circuit to select any of a plurality of taps of a corresponding transformer among the plurality of transformers.

8. A method for operating the plasma processing apparatus according to claim 3, comprising:

a first step of controlling the plurality of switchers to set the transformation ratios of the plurality of transformers; and a second step of controlling the plurality of switchers to set the transformation ratios of the plurality of transformers to transformation ratios which are higher than the transformation ratios of the plurality of transformers set in the first step.

9. The plasma processing apparatus according to claim 6, wherein the second control performed by the controller causes voltages output to secondary sides of the transformers to decrease from voltages output to the secondary sides of the transformers by the first control, thereby causing currents supplied to the plurality of heaters to decrease from currents supplied to the plurality of heaters by the first control.

10. A power supply device for a plasma processing apparatus, comprising:

a plurality of heaters which are provided in a mounting table of the plasma processing apparatus;

a plurality of transformers configured to step down a voltage from an alternating-current power source, each of the plurality of transformers including a primary coil connected to the alternating-current power source and a secondary coil; and a plurality of zero-cross control type solid state relays each of which is provided between one corresponding heater among the plurality of heaters and the secondary coil of one corresponding transformer among the plurality of transformers to control heat on a workpiece.

11. The power supply device according to claim 10, further comprising:

a plurality of switchers which change transformation ratios of the plurality of transformers.

12. The power supply device according to claim 10, wherein each of the plurality of switchers comprises a relay circuit to select any of a plurality of taps of a corresponding transformer among the plurality of transformers.

* * * * *